(12) United States Patent
Parish, IV et al.

(10) Patent No.: US 6,462,949 B1
(45) Date of Patent: Oct. 8, 2002

(54) ELECTRONIC ENCLOSURE COOLING SYSTEM

(75) Inventors: Overton L. Parish, IV, Lubbock, TX (US); Roger S. DeVilbiss, Dallas, TX (US)

(73) Assignee: Thermotek, Inc., Carrollton, TX (US)

( * ) Notice: Subject to any disclaimer, the term of this patent is extended or adjusted under 35 U.S.C. 154(b) by 0 days.

(21) Appl. No.: 09/633,060

(22) Filed: Aug. 7, 2000

(51) Int. Cl.[7] .................................. H05K 7/20

(52) U.S. Cl. ................ 361/699; 361/689; 361/696; 361/697; 361/698; 361/701; 361/702; 257/714; 257/715; 174/15.1; 174/15.2; 165/80.4

(58) Field of Search .................. 361/684–691, 361/693–700, 709, 711; 257/714–716, 721, 722; 174/15.1, 15.2, 16.1–16.3; 165/80.2, 80.3, 80.4, 80.5, 104.33, 104.34, 122, 185; 454/184

(56) References Cited

U.S. PATENT DOCUMENTS

| | | | |
|---|---|---|---|
| 3,776,305 A | * 12/1973 | Simmons ............... | 165/104.25 |
| 4,072,188 A | 2/1978 | Wilson et al. ............. | 165/80 |
| 4,183,400 A | * 1/1980 | Seifert ................... | 165/104.29 |
| 4,381,032 A | 4/1983 | Cutchaw ................. | 165/46 |
| 4,558,395 A | 12/1985 | Yamada et al. .......... | 361/385 |
| 4,729,060 A | 3/1988 | Yamamoto et al. ........ | 361/385 |

(List continued on next page.)

FOREIGN PATENT DOCUMENTS

| | | |
|---|---|---|
| CH | 670 541 A5 | 6/1989 |
| DE | 3522127 A1 | 1/1987 |
| EP | 0 489 326 A2 | 6/1992 |

OTHER PUBLICATIONS

Tom Lee, T.Y. et al., "Compact Liquid Cooling System for Small, Moveable Electronic Equipment"; IEEE Transaction on Components, Hybrids, and Manufacturing Technology, vol. 15, No. 5, Oct. 15, 1992; New York, US; pp. 786–793.
PCT International Search Report (ISA/210) prepared by European Patent Office completed Sep. 6, 2001 by A. Rubenowitz.
Tom Lee, T.Y. et al., "Compact Liquid Cooling System for Small, Moveable Electronic Equipment"; IEEE Transaction on Components, Hybrids, and Manufacturing Technology, vol.15, No. 5, Oct. 15, 1992; New York, US; pp. 786–793.
PCT International Search Report (ISA/120) prepared by European Patent Office completed Sep. 6, 2001 by A. Rubenowitz.

*Primary Examiner*—Boris Chervinsky
(74) *Attorney, Agent, or Firm*—Jenkens & Gilchrist, P.C.

(57) ABSTRACT

A cooling apparatus using "low profile extrusions" is disclosed. The cooling apparatus of the present invention may be incorporated into a closed loop liquid cooling system which is particularly well suited to heat removal from electronic components in applications where space is limited. A cooling system in accordance with the present invention is illustrated for use in a typical wireless telecommunication base station for removing heat from power amplifiers and other electronic components. Cooling is carried out by drawing heat away from the electronic components and into at least one low profile extrusion attached directly to the heat generating components or a heat sink, and transferring the removed heat to a cooling fluid circulating through a plurality of micro tubes or channels within each low profile extrusion. The cooling fluid is subsequently pumped through a liquid-to-air heat exchanger, to reject the removed heat into the atmosphere, prior to being recirculated through each of the low profile extrusions.

20 Claims, 7 Drawing Sheets

U.S. PATENT DOCUMENTS

| | | |
|---|---|---|
| 4,854,377 A | 8/1989 | Komoto et al. ............. 165/80.4 |
| 4,884,630 A | 12/1989 | Nelson et al. ............... 165/170 |
| 4,896,716 A | 1/1990 | Sotani et al. .................. 165/54 |
| 4,909,315 A | 3/1990 | Nelson et al. ............. 165/80.3 |
| 4,982,274 A | 1/1991 | Murase et al. ................. 357/82 |
| 5,005,640 A | 4/1991 | Lapinski et al. ............. 165/170 |
| 5,036,394 A | 7/1991 | Umezawa .................... 357/82 |
| 5,054,296 A | 10/1991 | Sotani et al. ............... 62/259.1 |
| 5,084,966 A | 2/1992 | Murase .................. 29/890.043 |
| 5,099,311 A | 3/1992 | Bonde et al. ................. 357/82 |
| 5,159,529 A | 10/1992 | Lovgren et al. ............. 361/385 |
| 5,186,252 A | 2/1993 | Nishizawa et al. ......... 165/181 |
| 5,199,487 A | 4/1993 | DiFrancesco et al. ....... 165/168 |
| 5,203,401 A * | 4/1993 | Hamburgen et al. ....... 165/80.4 |
| 5,263,538 A | 11/1993 | Amidieu et al. ............ 165/168 |
| 5,283,464 A | 2/1994 | Murase ....................... 257/714 |
| 5,285,347 A * | 2/1994 | Fox et al. .................. 165/80.3 |
| 5,323,847 A | 6/1994 | Koizumi et al. ........ 165/104.33 |
| 5,342,189 A | 8/1994 | Inamura ..................... 425/461 |
| 5,353,639 A | 10/1994 | Brookins et al. ............. 72/363 |
| 5,370,178 A * | 12/1994 | Agonafer et al. ........... 361/697 |
| 5,388,635 A | 2/1995 | Gruber et al. .............. 165/80.4 |
| 5,409,055 A | 4/1995 | Tanaka et al. ......... 165/104.33 |
| 5,465,782 A | 11/1995 | Sun et al. ............. 165/104.26 |
| 5,555,622 A | 9/1996 | Yamamoto et al. .... 29/890.053 |
| 5,567,493 A | 10/1996 | Imai et al. ................. 428/36.9 |
| 5,586,004 A * | 12/1996 | Green et al. ................. 361/699 |
| 5,615,086 A | 3/1997 | Collins et al. ............. 361/704 |
| 5,636,684 A | 6/1997 | Teytu et al. ............. 165/80.4 |
| 5,642,775 A | 7/1997 | Akachi .................. 165/104.14 |
| 5,675,473 A | 10/1997 | McDunn et al. ............. 361/699 |
| 5,692,558 A | 12/1997 | Hamilton et al. .......... 165/80.4 |
| 5,729,995 A * | 3/1998 | Tajima ....................... 361/689 |
| 5,731,954 A * | 3/1998 | Cheon ........................ 361/699 |
| 5,737,186 A | 4/1998 | Fuesser et al. .............. 361/699 |
| 5,768,103 A * | 6/1998 | Kobrinetz et al. .......... 361/699 |
| 5,831,824 A * | 11/1998 | McDunn et al. ............. 361/699 |
| 5,901,037 A * | 5/1999 | Hamilton et al. ........... 361/699 |
| 5,923,533 A * | 7/1999 | Olson ........................ 361/699 |
| 5,960,866 A | 10/1999 | Kimura et al. ......... 165/104.33 |
| 6,055,157 A * | 4/2000 | Bartilson .................... 361/699 |
| 6,058,010 A * | 5/2000 | Schmidt et al. ............. 361/689 |
| 6,089,314 A * | 7/2000 | Becker et al. .............. 361/699 |
| 6,101,715 A | 8/2000 | Fuesser et al. ........... 29/890.03 |
| 6,125,036 A * | 9/2000 | Kang et al. ................. 361/700 |

\* cited by examiner

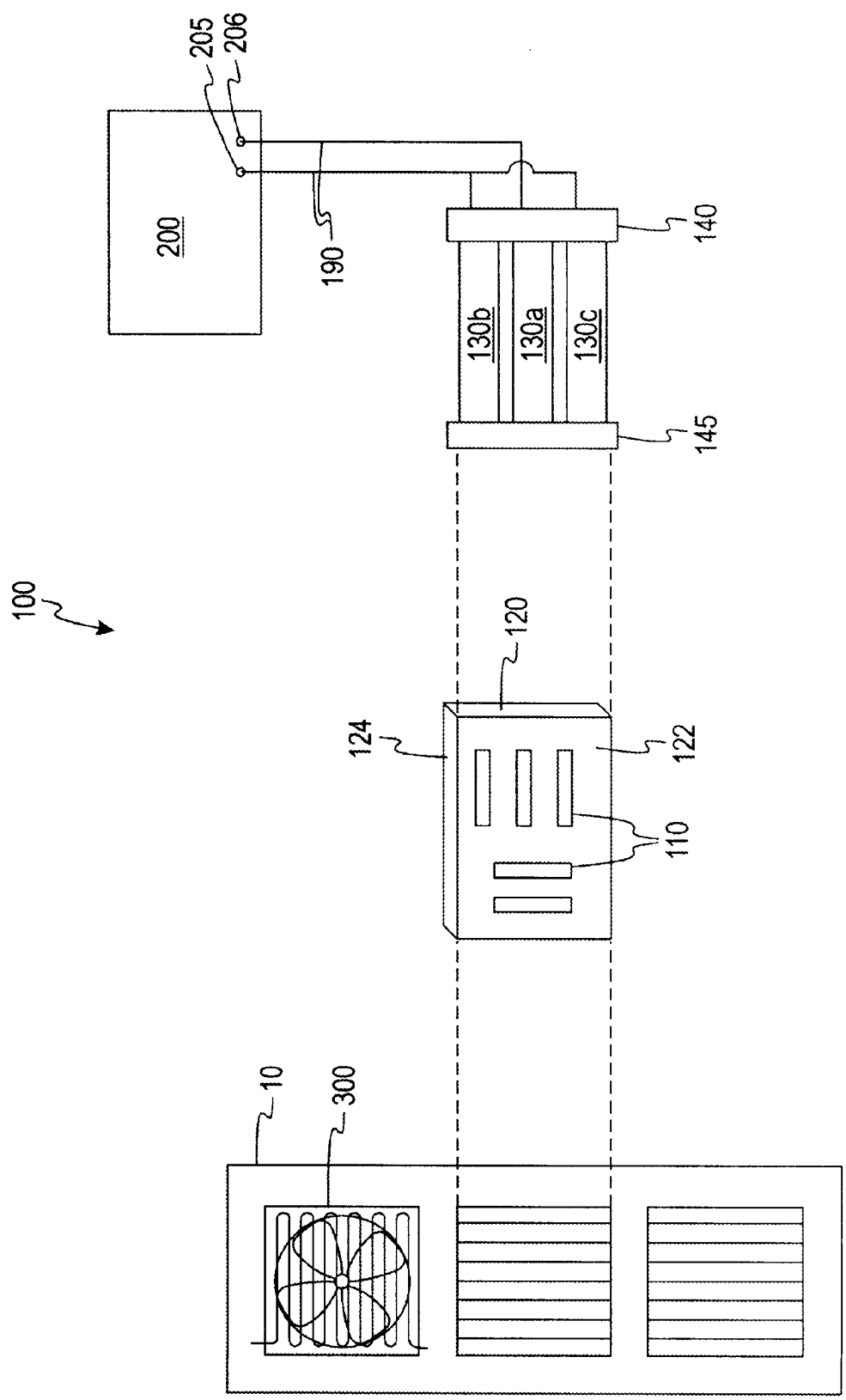

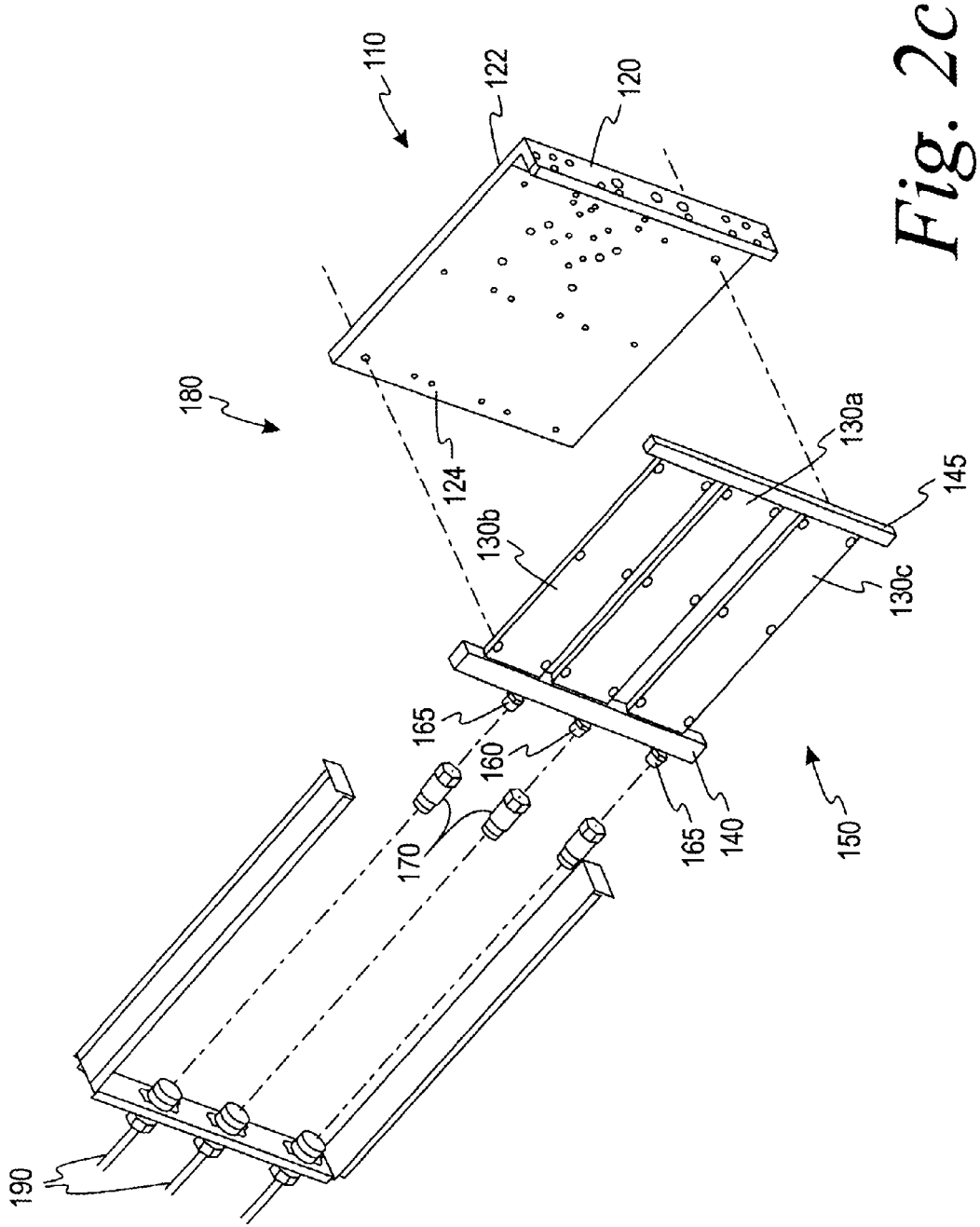

ELECTRONIC ENCLOSURE COOLING SYSTEM

RELATED PATENTS

This application is a related application of commonly owned and co-pending U.S. patent application Ser. No. 09/368,183 filed on Jun. 8,1999, which is incorporated in its entirety herein by reference.

BACKGROUND OF THE INVENTION

1. Field of the Invention

The present invention pertains generally to cooling apparatus, and more particularly, but not by way of limitation, to a cooling apparatus using "low profile extrusions." More specifically, the cooling apparatus of the present invention is particularly suited to cooling high watt density subassemblies such as power amplifiers and filters commonly used in modern telecommunications equipment.

2. History of the Related Art

As explained in greater detail below, the cooling system of the present invention is capable of removing heat generated by electronic equipment in a particularly dense environment, as is commonly encountered in a cabinet housing power amplifiers for telecommunications equipment. In these types of applications, space is extremely limited within the cabinet, and control of thermal cycling is critical.

As used in this document, the term "low profile extrusion" refers to an integral or unitary piece of metal having a series of micro extruded hollow tubes or channels formed therein for containing a fluid. The micro tubes or channels will typically have an effective diameter ranging from about 0.0625 inches to about 0.5000 inches, but can also have significantly smaller diameters.

Preferred low profile extrusions are sold by Thermalex, Inc. of Montgomery, Ala. A brochure entitled "Thermalex, Inc.—Setting A Higher Standard in Aluminum Extrusions" (herein after the "Thermalex Brochure") provides additional detail regarding the Thermalex low profile extrusions and is incorporated herein by reference. U.S. Pat. No. 5,342,189, which is incorporated herein by reference, provides additional detail regarding an extrusion die for making such low profile extrusions. U.S. Pat. No. 5,353,639, which is incorporated herein by reference, provides additional detail regarding a method and apparatus for sizing a plurality of micro extruded tubes used in such low profile extrusions. These low profile extrusions are commercially available in strip form (having a generally rectangular geometry) or coil form (a continuous strip which is coiled for efficient transport).

It is notable, that although the micro tubes or channels described herein have an effective diameter, because the low-profile extrusion is formed of a single piece of metal which is extruded, it is possible to form channels with square, rectangular, or almost any geometry. Moreover, it is possible to extrude fins, grooves or wick structures on the interior of the channels without any additional machining steps. The low profile extrusions preferably have multi-void micro extruded tubes designed to operate under the pressures and temperatures required by modern environmentally safe refrigeration fluids and to resist corrosion. Such low profile extrusions are preferably formed from aluminum, although it is possible to use other metals or alloys which are sufficiently malleable to be extruded and have relatively high heat conductivity.

SUMMARY OF THE INVENTION

The present invention discloses a low profile cooling system which is particularly well suited for cooling power amplifiers and other electronic components housed within a wireless telecommunications base station. Telecommunications base stations are typically cabinet-like structures, containing racks of electronic equipment, which are located outdoors and exposed to a variety of environmental conditions including temperature variations, rain and other natural conditions. These base stations further include a large number of power amplifiers and other electronic components mounted on cards or metal plates for the conduction of heat. The metal plates, which act as heat sinks, will typically have power amplifiers and other components mounted on one side and fins or other cooling structures mounted on the opposite site. Typically, ambient air will be circulated in high volumes throughout the entire cabinet and across the fins of each metal plate to result in the removal of heat from the electronic components by conduction into the plate and convection from the plate to the air.

In one embodiment of the present invention, a closed liquid loop cooling system provides superior heat removal to the conventional air circulation method. The low profile extrusions are fitted with end caps or manifolds at opposite ends, and conduits or plumbing to carry a heat transfer fluid to and from each of the extrusions. The cooling system of the present invention generally comprises one or more low profile extrusions, a heat transfer fluid, a means for circulating the heat transfer fluid, and means for removing heat from the heat transfer fluid.

As noted earlier, each low profile extrusion has a plurality of micro tubes with micro tube inlets and micro tube outlets, and a substantially flat exterior surface adapted for receiving heat from at least one heat generating component. The end caps interconnect the micro tube inlets and outlets of each low profile extrusion in fluid communication and further connect the low profile extrusions in fluid communication with each other in either a series or parallel configuration. One or both of the end caps or manifolds may also contain openings or connections for a fluid input tube and a fluid output tube. The means for circulating the heat transfer fluid circulates the fluid through the inlet tube, the end cap inlet, the plurality of micro tubes in each low profile extrusion, the end cap outlet, and the outlet tube.

In one embodiment, heat generated by the electronic components, such as power amplifiers, is conducted away from the components through the metal plate on which they are mounted, into the low profile extrusions, and then passed to the heat transfer fluid circulating therein. The heat transfer fluid is pumped by the circulating means into and out of each low profile extrusion and through the means for removing heat from the fluid before being recirculated and passed again through the low profile extrusions.

BRIEF DESCRIPTION OF THE DRAWINGS

A more complete understanding of the method and apparatus of the present invention may be obtained by reference to the following Detailed Description when taken in conjunction with the accompanying Drawings wherein:

FIG. 1 is a schematic diagram of the present invention, shown as a closed loop circulation, fluid cooling system for removal of heat from power amplifiers and other heat generating components;

FIG. 2C is an exploded perspective view of the cooling fluid backplane of FIG. 2A attached to a heat sink with power amplifiers mounted thereon;

DETAILED DESCRIPTION

Figure 2A:
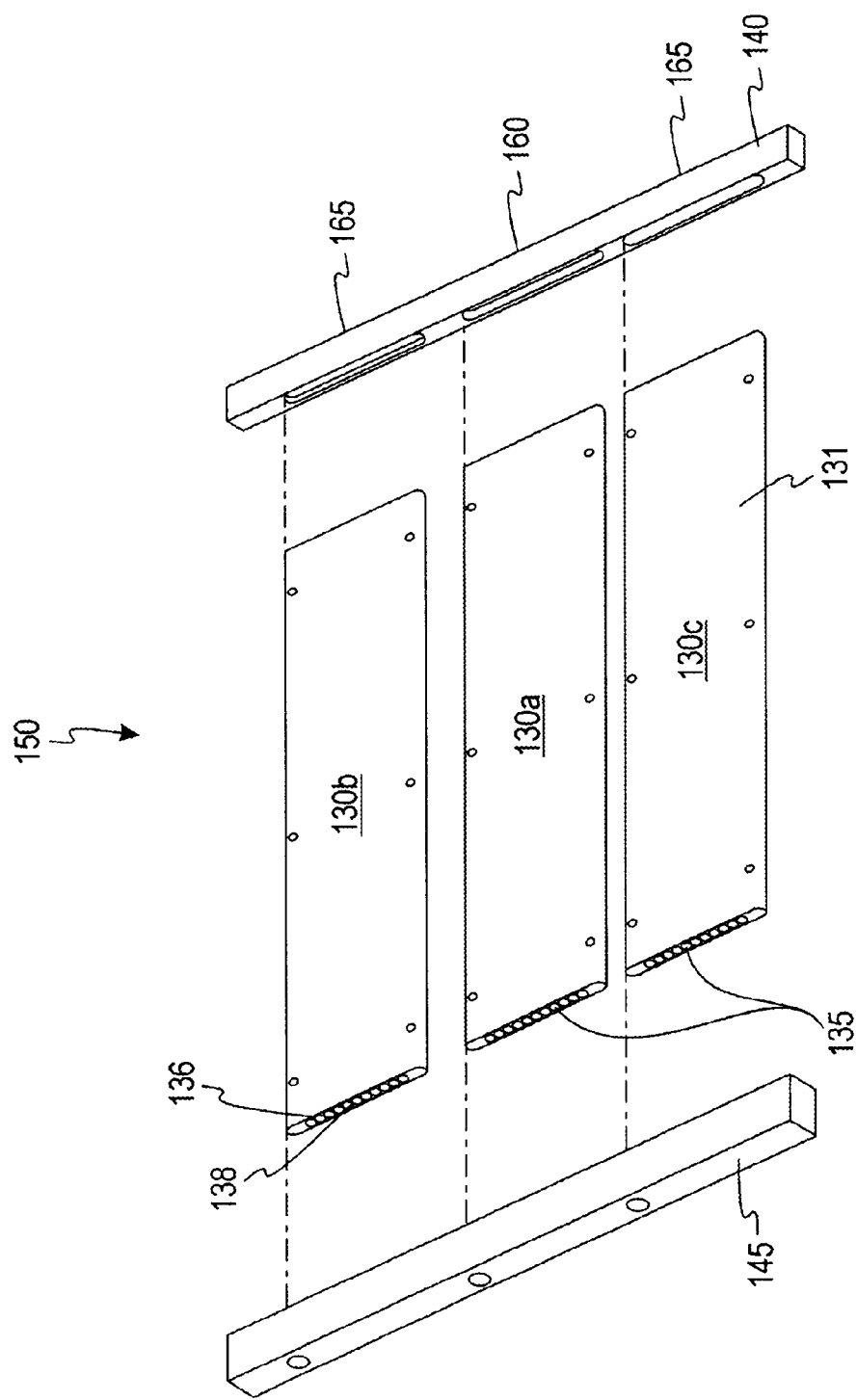
FIG. 2A is an exploded perspective view of a cooling fluid backplane with three low profile extrusions arranged between a pair of manifolds for directing fluid flow.

The preferred embodiments of the present invention and their advantages are best understood by referring to FIGS. 1–5 of the drawings, like numerals being used for like and corresponding parts of the various drawings. The present invention is illustrated herein by example, and various modifications may be made by a person of ordinary skill in the art.

As best seen in FIG. 1, one embodiment of the present invention is shown in a schematic diagram in which a heat transfer fluid is circulated in a closed loop to cool components within a telecommunications base station 10. The cooling system 100 of the present invention removes heat from power amplifiers and other electrical components 110 by conducting the heat into a metal plate or heat sink 120 on which the components 110 may be directly mounted to one side 122. The removed heat is then conducted from the heat sink 120 into at least one low profile extrusion 130 mounted to opposite side 124 of the heat sink 120.

Each low profile extrusion 130 is filled with a conventional refrigeration or heat transfer fluid, as known in the art. In one embodiment, the heat transfer fluid may be a water/ethylene glycol mixture, as commonly used in automotive cooling applications. The water/ethylene glycol mixture may be blended in various ratios, but will normally range between about 40/60 and 60/40 with a 50/50 ratio being acceptable for most applications of the present invention. Of course, other cooling fluids may be substituted to adjust for specific operating conditions. By way of example only, water/propylene glycol mixtures may be used, as well as various organic salt solutions such as DYNALENE.

Figure 3A:
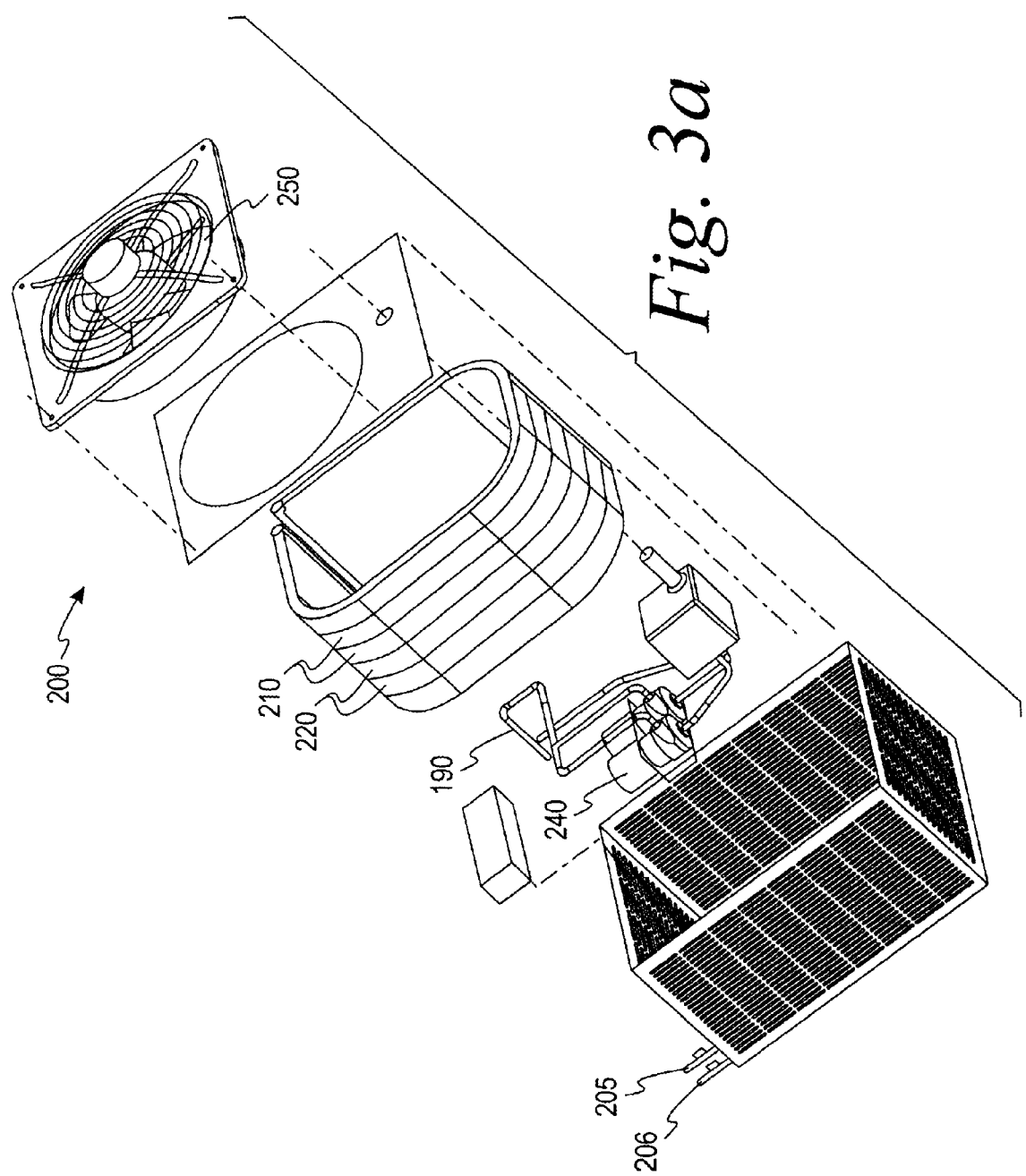
FIG. 3A is a exploded perspective view of a liquid-to-air heat exchanger unit in the form of a low-pressure drop external condenser unit.

In one embodiment, several low profile extrusions 130 may be fitted between a pair of end caps or manifolds 140, 145 for directing fluid flow to each of the extrusions 130 in parallel or from one extrusion to another in series. As the cooling fluid passes though micro tubes 135 of the low profile extrusion 130 it removes heat from the body of the extrusion 130 and may undergo a phase change or evaporative process. The heated fluid is then passed by a series of conduits 190 from the housing 10 to an external condenser unit 200 much like that used in residential air conditioning systems. As best seen in FIG. 3A, the external condenser unit 200 has a condensation coil 210 which is provided with cooling fins 220 and is positioned about a central fan 250 which draws ambient air through the sides of the unit 200, across the cooling fins 220, into the center of the unit 200 and out through the top. The cooled and condensed fluid is then recirculated back into the housing 10 and through the low profile extrusions 130. Each element of the closed loop cooling system 100 will now hit be described in further detail.

With reference to FIG. 2A, an exploded perspective view of a cooling fluid backplane 150 is shown. The backplane 150 is formed of three low profile extrusions 130 arranged between a pair of manifolds 140,145 for directing fluid flow. As noted earlier, each of the low profile extrusions 130 is formed of an integral or unitary piece of material having a series of micro-extruded hollow micro tubes or channels 135 formed therein for containing a fluid. Although the tubes or channels 135 are described herein as having effective diameters, because the low profile extrusion 130 is formed of a single piece of metal which is extruded, it is possible to form channels 135 which are square, rectangular, or of almost any geometry. Moreover, it is possible to extrude fins, grooves, or wick structures on the interior of the channels 135 without any additional machining steps. In one embodiment, these channels or micro tubes 135 have a generally rectangular shape with linear partitions 138 between individual channels 135.

Although it is possible to form the channels 135 with virtually any geometry, channels having at least one flattened surface 136 are generally preferred. This is because heat transfer is more efficient between well-mated surfaces which are flush to each other. As the exterior of the low profile extrusions 130 will have a generally flat outer surface 131 for receiving heat from a generally flat heat sink 120, so too the inner surfaces of the channels 135 should have flattened surfaces 136 for receiving heat from the exterior 131 of the low profile extrusion 130. In one embodiment, these channels 135 are rectangular in shape as this provides not only the flattened interior surface 136 which is desirable, but also allows for the maximum volume of fluid to be passed through the low profile extrusion 130 without compromising the strength or mechanical integrity of the part. It is also notable that while these low profile extrusions 130 are commonly formed of aluminum it is possible to use other metals or alloys which are sufficiently malleable to be extruded and have relatively high heat conductivity.

Returning again to FIG. 2A, the cooling fluid backplane 150 is provided with a pair of manifolds 140, 145 for directing fluid flow between each of the three low profile extrusions 130. These manifolds 140, 145 may connect the low profile extrusions 130 either in parallel or in series. In one embodiment, the first manifold 140 is provided with a single fluid inlet 160 and two fluid outlets 165. The second manifold 145 serves to cap or seal the opposite ends of the low profile extrusions 130 and is designed to receive fluid from the central low profile extrusion 130a and then split the flow and redirect it to the two outer low profile extrusions 130b, 130c equally.

Figure 2B:
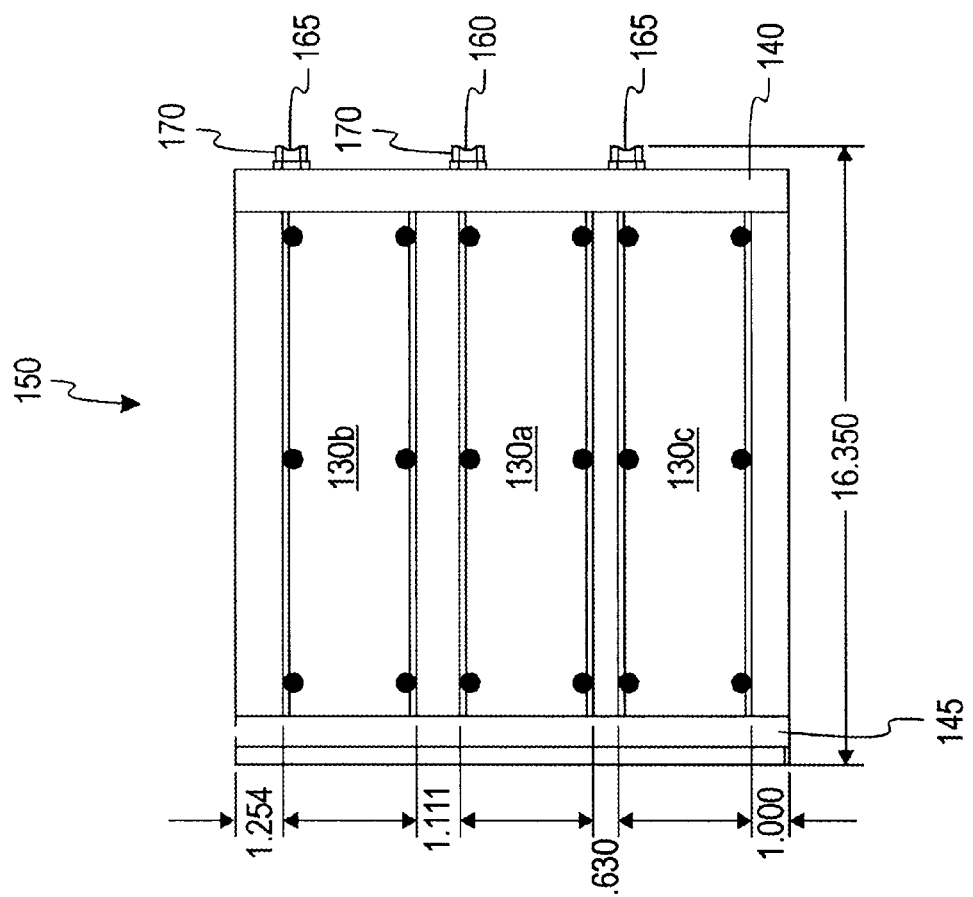
FIG. 2B is a front elevational view of the cooling fluid backplane of FIG. 2A with three low profile extrusions arranged between a pair of manifolds for directing fluid flow.

With reference now to FIG. 2B, an assembled cooling fluid backplane 150 is shown with three low profile extrusions 130a, 130b, 130c arranged between a pair of manifolds 140, 145 for directing fluid flow. In operation, fluid is pumped through the fluid inlet 160 of the first manifold 140 and into the central low profile extrusion 130a of the backplane 150, into the second manifold 145 where the flow is split and diverted equally into the two outer low profile extrusions 130b, 130c, and eventually out through the two fluid outlets 165 of the backplane 150. It is notable that, in one embodiment, the backplane 150 is provided with three dripless quick connect fittings 170. These fittings 170 will typically allow a user to insert or remove a fluid backplane 150 from the system 100 without threaded fasteners, soldering, or brazing steps of any kind. These fittings 170 are known in the art and generally comprise a male portion and a female portion which may be snap fit or pressed together and are commonly provided with O-rings or other gaskets to ensure a drip-free connection. Of course, it is understood that a small drip pan or catch pan, not shown, may be added to the system 100 to provide an extra measure of safety in an electronics intensive environment such as a telecommunications based station 10. Alternatively, it is also possible to locate the plumbing connections behind an isolation wall, not shown, to further minimize risk to electronics from small fluid leaks. It is also understood that the entire cooling system may be hard plumbed throughout the cabinet with mechanical snap or press fit type connections between the fixed cooling fluid backplanes and the removable power amplifier cards.

Turning now to FIG. 2C, an exploded perspective view of a cooling fluid backplane 150 is shown attached to a heat sink 120 with power amplifiers and other electronic components 110 mounted thereon. Looking at FIG. 2C, it is relatively easy to observe a conductive path in which heat may be transferred from the power amplifiers and other electronic components 110 to the metal heat sink 120, from the heat sink 120 to the low profile extrusion 130, and from the body of the low profile extrusion 130 to the refrigeration fluid which is circulating therein. FIG. 2C also illustrates how the electronic components 110, the heat sink 120 and the cooling fluid backplane 150 can all be brought together into a modular low profile amplifier unit 180.

Conventional telecommunications base stations, and similar electronics cabinet structures, commonly use forced air convection to cool electronic components thereby requiring large fin-like projections to be placed on each of the heat sinks. These fins may vary in size but are quite commonly about 1.0 to 3.0 inches in height. A single prior art plate or heat sink, not shown, with electronic components mounted on one side and cooling fins mounted on the other will generally be about 3.0 to 4.0 inches in thickness. In contrast, a heat sink 120 of the present invention (FIG. 2C) with electronic components 110 mounted on one side 122 and a cooling fluid backplane 150 mounted on the other side 124 will generally have a thickness of only about 2.0 to 2.5 inches. Thus, by using the liquid loop cooling system of the present invention, it is possible to increase the electronic equipment capacity of a typical telecommunications base station while also achieving lower electronic component temperatures.

With reference now to FIG. 3A, an exploded perspective view of a liquid-to-air heat exchanger unit 200 is shown. The liquid-to-air heat exchanger unit 200 is very similar in design to condenser units used in conventional residential air conditioning systems. In this design, heated or evaporated heat transfer fluid enters the condenser 200 through an input valve 205 and is then circulated through a series of tubes or conduits 210 which are shaped in a generally circular or box-like design about a central cooling fan 250. The condenser tubes 210 are generally spaced several inches apart in the vertical direction with metal fins 220 disposed between each layer of tubing 210. In operation, the central cooling fan 250 is driven by an electric motor, not shown, so as to draw ambient air through the cooling fins 220 and into the center of the condenser unit 200 and then to blow the air out through the top of the unit 200. The heat transfer fluid is cooled by conducting heat from the tubing 210 to the metal fins 220 which dissipate the removed heat by convection to the ambient air which is being drawn across them. The fan/radiator approach for a condenser unit 200 arranged in this box or circular fashion provides optimal heat removal due to the high surface area of the cooling fins 220 and the low pressure drop of the heat exchanger 200 across these fins 220. It is also noted that this style heat exchanger 200, in one alternative embodiment, may be modified from the design of a conventional air conditioning system condenser unit to allow relatively low pressure fluids to be circulated through the heat exchanger 200 using tubing 210 with larger internal flow diameters than would be used in a high pressure air conditioning system.

In operation, heated fluid will normally enter the condenser unit 200 through an input valve 205, be cooled or condensed through the series of cooling tubes 210, drawn into at least one electrically powered fluid pump 240, pumped out of the condenser unit 200 through an outlet valve 206, and then recirculated throughout the cabinet or housing 10 containing the electrical components 110. Note that it is understood that two or more fluid pumps 240 may be used in place of the one fluid pump to incorporate redundancies into the cooling system 100.

Figure 5:
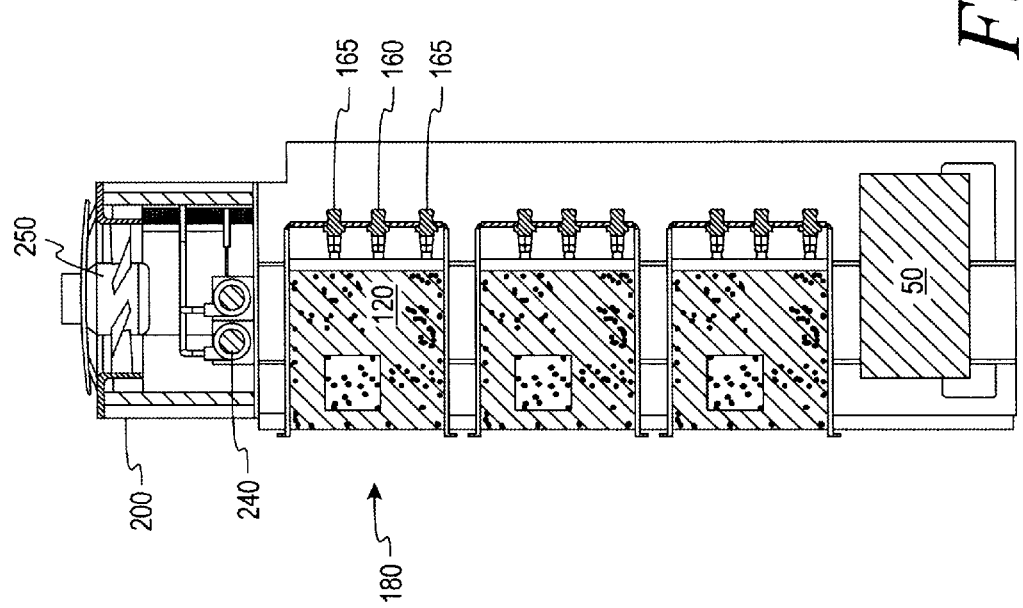
FIG. 5 is cutaway side view along section line 5—5 of FIG. 4 and further illustrating a possible configuration for the cooling system of the present invention.
Figure 4:
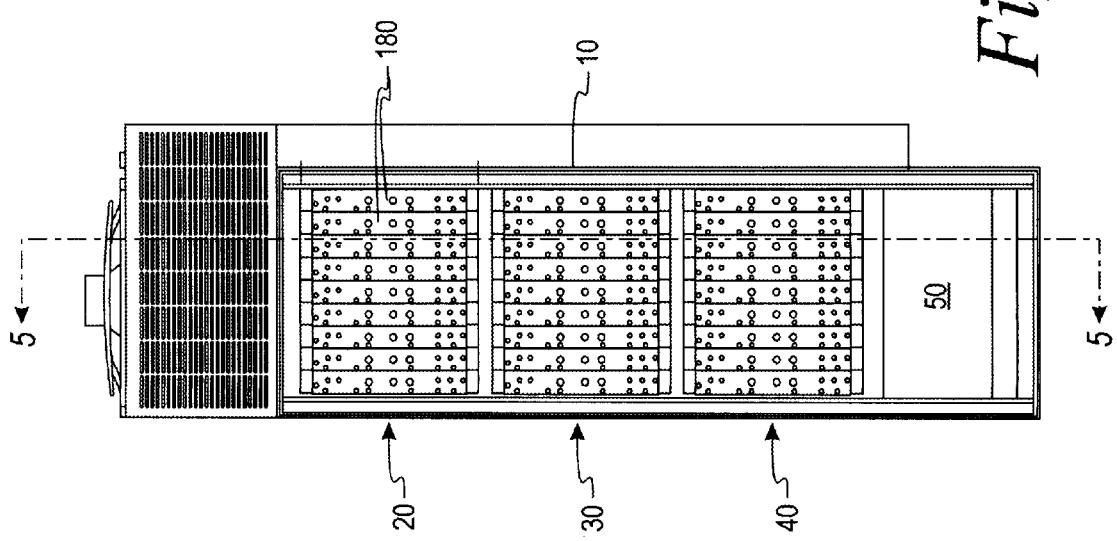
FIG. 4 is a front elevational view of a telecommunications base station implementing the cooling system of the present invention with the front panel of the housing and the plumbing removed to better illustrate the positioning of the power amplifiers and the external condenser unit.

The cooling system 100 further uses a low pressure drop liquid-to-air heat exchanger or condenser unit 200 (FIG. 3A) that can be configured to a cabinet or housing 10 roof mount design, as shown in FIGS. 4 and 5. This configuration is ideal for dumping removed heat into the atmosphere due to the high amount of surface area of a design, the need for only one fan 250 to draw ambient air through the cooling fins 220, low noise operation levels, and low cost due to the similarity to condenser units used in conventional air conditioning systems. Moreover, the roof mount or top hat design 200 is modular and may be readily taken on or off of the cabinet or housing 10 containing electrical components 110. This design should permit the condenser unit 200 to be easily maintained or replaced if necessary and also allow the housing or cabinet 10 and condenser unit 200 combination to occupy a minimum footprint. It is also understood that should a cabinet 10 be located in an indoor environment, it is possible to remove the condenser unit 200 altogether and with the appropriate plumbing or conduits, move the condenser unit 200 to a remote location such as the roof or exterior of a building.

It is the inventors' belief that this type of liquid-to-air heat exchanger, normally associated with residential air conditioning systems, has not been implemented in liquid loop electronic cooling applications. Heat exchangers or condenser units, of this sort, are readily available and offer a considerable amount of heat rejection within a design which is both compact in size and relatively low in cost. In short, although other means for removing heat from the heat transfer fluid are available, it would be difficult to achieve comparable system performance without incurring a great deal of additional expense.

Figure 3B:
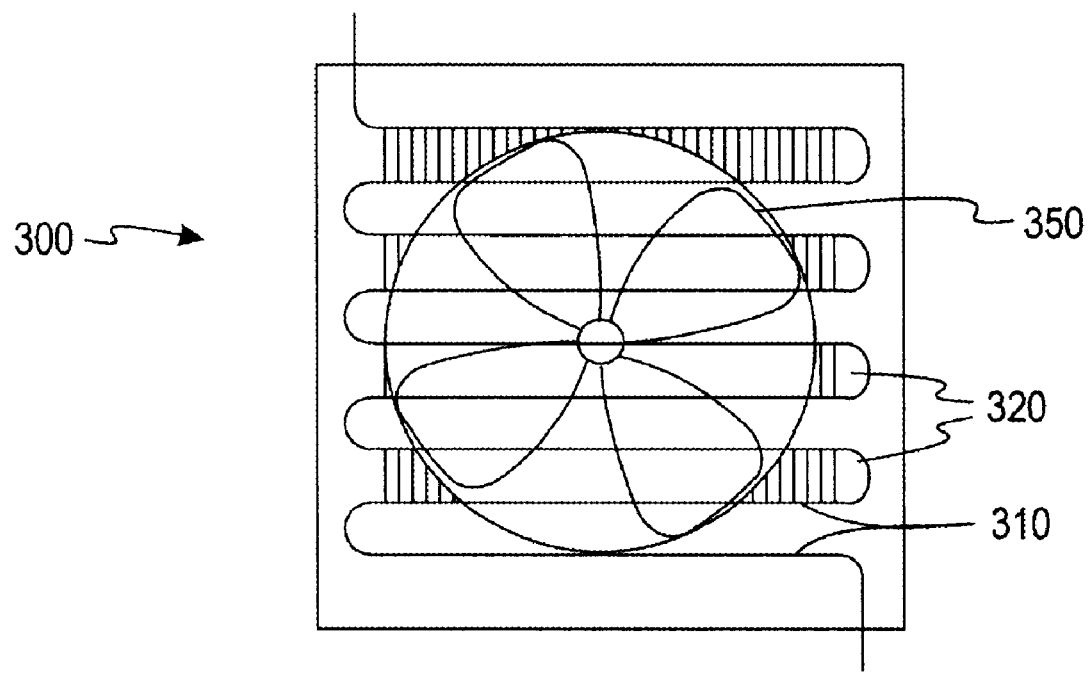
FIG. 3B is a front elevational view of a liquid-to-air heat exchanger unit in the form of a flat pack radiator condenser unit.

Alternative approaches using air cooling of the heat transfer fluid would generally not provide the efficiency, reliability or cost advantages of this approach. However, if desired, it is possible to reposition the fan/radiator combination into alternative configurations. By way of example only, one such configuration would be a flat pack 300 design, as shown in FIG. 3B, in which the entire length of condenser tubing 310 is zig-zagged back and forth in a single plane with one or more cooling fans 350 blowing air across and through the radiator. The condenser tubing 310 may also have attached cooling fins 320 to increase surface area and heat dissipation. This flat pack 300 design may be desirable in applications where it is necessary to set the condenser unit off to the side of the housing or cabinet 10 while still maintaining a minimal footprint. It is also notable that, as shown in FIG. 1, such a flat pack 300 configuration of a radiator/fan combination maybe used internally within the housing 10 to remove excess heat from the air in conjunction with the cooling liquid backplanes 150 attached directly to the heat sinks 120 on which the electrical components 110 are mounted. A flat pack radiator, used in this manner, could also remove heat generated by low watt density components, for which liquid loop cooling is not economical, and by solar loads on the base station itself. When used in this configuration, the cooling backplanes 150 and the flat pack radiator 300 as well as the external condenser unit in either a top hat 200 (FIGS. 4 and 5) or flat pack 300 (FIG. 3B) design may all be part of the same closed liquid loop supported by the same pumps 240.

With reference now to FIG. 4, a front elevational view of a telecommunications base station 10 implementing the cooling system 100 of the present invention is shown. For clarity, the front panel of the housing 10 and the various plumbing or other conduits are removed to better illustrate the positioning of the power amplifiers 110 and the external condenser unit 200.

As illustrated here, a typical telecommunications base station 10 may have three horizontal rows or racks 20, 30, 40 of electrical components 110 as well as a backup power supply 50 and an external condenser unit 200. Each of the racks 20, 30, 40 of electrical components 110 are further subdivided into nine discrete cards or plates 120 on which electrical components 110 such as power amplifiers may be directly mounted. Of course, it is understood that the number of racks 20, 30, 40 and number of plates 120 per rack 20, 30, 40 is largely dependent upon the dimensions of a particular housing 10. Accordingly, the cooling system 100 of present invention could be made to handle larger or smaller numbers of plates 120 with the appropriate modifications to the plumbing within the housing 10.

While conventional telecommunications base stations 10 will normally require these plates 120 to be spaced a considerable distance apart to allow for cooling fins and a proper amount of air flow between the plates 120, by using the cooling system 110 of the present invention, it is possible to stack these plates 120 almost directly adjacent to each other. Note that each of these plates 120 have been provided with a cooling fluid backplane 150 as described earlier. As shown in FIG. 5, each plate/fluid backplane combination 180 has one fluid inlet 160 and two fluid outlets 165 which circulate fluid throughout the micro tubes or channels 135 (FIG. 2A) of the three low profile extrusions 130 mounted to each heat sink 120. A fluid reservoir, not shown, may also be provided to assist in maintaining a consistent fluid level throughout the system 100. The external condenser unit 200 shows a radiator fan combination in a roof mount or top hat configuration.

With reference now to FIG. 5, a cut away side view along section line 5—5 of FIG. 4 is shown. This figure illustrates a possible system configuration and liquid loop for the cooling system 100 of the present invention. As shown in FIG. 5, and referring back to FIGS. 1–4, heat transfer fluid is pumped from one or more pumps 240 located in the external condenser unit 200 into the housing 10 containing the electronic components 110 by conduits 190 through at least one fluid inlet 160 into a first end cap 140 where it is distributed through at least one low profile extrusion 130 formed with a plurality of micro tubes or channels 135, through the micro tubes or channels 135 and into a second end cap 145 where it is passed through the micro tubes 135 of a second low profile extrusion 130 and back into the first end cap 140 where it is passed out through a fluid outlet 165 into a conduit 190 where it may be transported back up to the cooling unit 200 mounted on the roof or top of the housing 10 where it is air cooled and condensed and passed back into the one or more pumps 240 for recirculation throughout the system 100. As shown in FIG. 5, each heat sink 120 with the electrical components 110 mounted on one side 122 and the cooling fluid backplane 150 mounted on the opposite side 124 form a single modular amplifier unit 180. These units have one fluid inlet 260 and two fluid outlets 265 which are provided with dripless quick connect couplings 170 for ease in insertion and removal from the system 100. As noted earlier, the dripless quick connect fittings 170 are convenient in that they allow for drip free plumbing connections without the use of threaded fasteners, brazing, or welding steps. Of course, it is understood that any other suitable plumbing connectors may also be used, but that installation of additional modular amplifier units 180 may be more difficult. In one embodiment of the present invention, the entire cabinet or housing 10 of the telecommunications base station may be provided with pre-installed plumbing connections to each rack 20, 30, 40 and each card slot within the rack prior to use. In turn, this would allow users to add and remove amplifier units 180 in any possible configuration without any further plumbing needed in the system 100.

Although in the present design, the condenser unit 200 is shown as having two electrically powered pumps 240 to provide fluid circulation throughout the entire cooling system 100, it is understood that this system could be operated with either a single pump or with multiple pumps to incorporate a redundancy. It is also understood that one or more fluid pumps may be located at other positions throughout the system 100.

In one further embodiment of the present invention, the backup power supply 50 may also be cooled and maintained at a desired operating temperature with liquid loop cooling. The backup power supply 50 will commonly have a plurality of batteries capable of keeping the telecommunications base station functional in the event of an electrical power outage. In some instances, these batteries may also generate a considerable amount of heat. A cooled battery tray is formed of a flat metal sheet or tray on which a plurality of batteries are placed on an upper surface. The battery tray acts as a heat sink and conducts heat away from the batteries. At least one low profile extrusion is mounted to the lower surface of the battery tray and connected to the liquid loop, as described above, for the removal of generated heat. In operation, heat generated by the batteries is conducted into the battery tray, conducted from the battery tray into at least one low profile extrusion and passed on to the fluid circulating throughout the low profile extrusion. The heated fluid is then circulated through a heat exchanger for cooling prior to recirculation. It is further possible to use a stacked configuration of low profile extrusions having thermoelectric cooling (TEC) units disposed between them to cool the battery tray using both active and passive cooling techniques.

By way of example only, data is provided on a typical telecommunications base station 10 which has been fitted with the cooling system 100 of the present invention. In this particular example, the heat transfer fluid was a 50/50 mixture of water/ethylene glycol which was circulated throughout the system 100 at a rate of 0.4 gallons per minute. A radiator style or flat pack heat exchanger unit 300 was sized for a 10° C. rise at 500 watts, and had an air flow rate of about 170 cubic feet per minute. Measurements were obtained at a steady state achieved after 45 minutes of continuous operation. It was noted that an average base plate 120 backplane side 124 temperature was maintained at less than 18.7° C. above ambient under a 450 watt load. The average component side 122 temperatures of a base plate 120 were maintained at less than 24° C. above ambient temperatures under a 450 watt load. It was also noted that approximately 10% of the heat generated by the electronic components 110 generally goes into ambient air within the cabinet 10 and not into the fluid under a 450 watt load. As noted earlier, it is possible in at least one alternative embodiment to remove one of the electrical component racks 20, 30, 40 from the cabinet 10 and replace this with a flat pack 300 or other radiator/fan design to remove residual heat from the air within the cabinet 10. This radiator/fan combination 300 may also be plumbed into the existing closed loop system 100 and utilize the existing quick connect plumbing which is installed within the housing 10.

Advantages of the present cooling system 100 include reduced fin side 124 temperatures in comparison with conventional air cooled base stations. Electronic equipment will also have a reduction in thermal cycling, material decomposition, electromigration, diffusion effects and thermal stresses. The reduced temperatures and thermal cycling should lead directly to an increase in the life of the electronic components 110 themselves. It is estimated that for every 10° C. reduction in temperature, electronic device life may be increased by as much as a factor of two.

By implementing the cooling system 100 of the present invention, it is also possible to reduce the plate or heat sink 120 thickness, in comparison to conventional heat sinks with fins, on each amplifier unit 180 which should reduce the materials cost of each plate 120. The extended amplifier life should also lead to a reduction in replacement of amplifier units 180 which may result in additional savings of substantial amounts, given the cost of these units.

One final benefit to the cooling system of the present invention, would be reduced sealing issues relative to the outside environment. As noted earlier, many of these housings 10 are located outdoors and cooled by circulation of ambient air. Consequently, each card or power amplifier unit had to be individually sealed. In the present invention, the entire cabinet or housing 10 may be sealed and cooling within the housing 10 may be provided by the circulated heat transfer fluid.

Although preferred embodiments of the invention have been described in the examples and foregoing description, it will be understood that the invention is not limited to the embodiments disclosed, but is capable of numerous rearrangements and modifications of parts and elements without departing from the spirit of the invention, as defined in the following claims. Therefore, the spirit and the scope of the appended claims should not be limited to the description of the preferred embodiments contained herein.

What is claimed is:

1. An electronic enclosure cooling system comprising:
   a housing;
   at least one low profile extrusion of unitary construction adapted for receiving heat from heat generating components installed within the housing, said at least one unitary low profile extrusion being formed with a unitary array of micro tubes, said unitary array including a plurality of microtubes disposed in generally parallel, extruded relationship;
   at least one quick connect coupling in communication with said unitary array of microtubes;
   a closed fluid loop formed when said at least one unitary low profile extrusion is secured to said housing via said at least one quick connect coupling, said closed fluid loop comprised at least in part by said unitary array of microtubes, said closed fluid loop for containing a heat transfer fluid for removing heat from said heat generating components;
   a heat exchanger for removing heat from a heat transfer fluid; and
   means for circulating the heat transfer fluid from said heat exchanger, through said unitary array of microtubes, and back to said heat exchanger in said closed fluid loop.

2. The electronic enclosure cooling system of claim 1, wherein said heat exchanger is a liquid-to-air heat exchanger.

3. The electronic enclosure cooling system of claim 2, wherein said liquid-to-air heat exchanger further comprises a condenser coil having a plurality of cooling fins, said condenser coil being shaped to fit about a central cooling fan.

4. The electronic enclosure cooling system of claim 3, wherein said liquid-to-air heat exchanger is mounted externally on top of said housing.

5. The electronic enclosure cooling system of claim 2, wherein said liquid-to-air heat exchanger is a flat pack radiator.

6. The electronic enclosure cooling system of claim 1, further comprising a flat pack radiator disposed within said housing and connected to said closed fluid loop of said heat transfer fluid, wherein said flat pack radiator is adapted to remove heat from air within the housing.

7. The electronic enclosure cooling system of claim 1, further comprising a battery backup power system.

8. The electronic enclosure cooling system of claim 7, further comprising at least one battery cooling modular low profile unit for receiving heat from said battery backup power system, said at least one battery cooling modular low profile unit having a plurality of micro tubes connected to said closed fluid loop of said heat transfer fluid.

9. The electronic enclosure cooling system of claim 1, wherein said heat transfer fluid is a water/ethylene glycol mixture.

10. A modular low profile unit for use in a cooling system for removing heat from at least one heat generating component, said modular low profile unit comprising:
    a heat sink in contact with said at least one heat generating component;
    at least one low profile extrusion of unitary construction having an exterior surface in contact with said heat sink and adapted for receiving heat from said heat sink being formed with a unitary array including a plurality of microtubes disposed in generally parallel, extruded relationship, at least one of said plurality of microtubes being provided with a microtube inlet and a microtube outlet;
    a first fluid manifold providing fluid communication between said fluid inlet and said microtube inlet of said at least one unitary low profile extrusion;
    a second fluid manifold providing fluid communication between said fluid outlet and said microtube outlet of said at least one unitary low profile extrusion;
    at least one fluid inlet provided on one of said first fluid manifold and said second fluid manifold;
    at least one fluid outlet provided on one of said first fluid manifold and said second fluid manifold; and a quick connect coupling in communication with said at least one fluid outlet.

11. The low profile cooling system of claim 10, wherein said heat exchanger is a liquid-to-air heat exchanger.

12. The low profile cooling system of claim 11, wherein said liquid-to-air heat exchanger further comprises a condenser coil having a plurality of cooling fins, said condenser coil being shaped to fit about a central cooling fan.

13. The low profile cooling system of claim 11, wherein said liquid-to-air heat exchanger is a flat pack radiator.

14. A cooling fluid backplane comprising:

at least one low profile extrusion of unitary construction having an exterior surface adapted for receiving heat from a heat sink and being formed with a unitary array, said unitary array including a plurality of microtubes disposed in generally parallel, extruded relationship, at least one of said plurality of microtubes having a microtube inlet and a microtube outlet;

a first fluid manifold providing fluid communication between said fluid inlet and said microtube inlet of said at least one unitary low profile extrusion; and a second fluid manifold providing fluid communication between said fluid outlet and said microtube outlet of said at least one unitary low profile extrusion;

at least one fluid inlet provided on one of said first fluid manifold and said second fluid manifold; and at least one fluid outlet provides on one of said first fluid manifold and said second fluid manifold.

15. The cooling fluid backplane of claim 14, further comprising dripless quick connect fittings on said fluid inlet and said fluid outlet.

16. The cooling fluid backplane of claim 14, further comprising snap fit fasteners for attachment of said cooling fluid backplane to said heat sink.

17. A method of cooling an electronic enclosure having heat generating electronic components therein with a closed loop, liquid cooling system, said method comprising the steps of:

mounting said heat generating electronic components to a first side of at least one heat sink;

affixing said heat sink and said heat generating electronic components to a cooling fluid backplane comprised of at least one low profile extrusion being formed with a unitary array, said unitary array including a plurality of microtubes disposed in generally parallel, extruded relationship, wherein said heat sink and said cooling fluid backplane comprise a modular low profile unit;

placing said modular low profile unit within an enclosure adapted to receive said modular low profile unit;

conducting heat from said at least one heat sink into said cooling fluid backplane;

circulating a heat transfer fluid throughout said cooling fluid backplane;

passing said heat transfer fluid through a heat exchanger; and recirculating the heat transfer fluid throughout the cooling fluid backplane and the heat exchanger to form a closed loop and to thereby cool said heat generating electronic components.

18. The method of claim 17, further comprising the steps of:

providing a flat pack radiator;

disposing said flat pack radiator within the enclosure to remove heat from air within the enclosure; and circulating the heat transfer fluid throughout the flat pack radiator, the cooling fluid backplane and the heat exchanger to form a closed loop and to thereby cool said heat generating electronic components.

19. The electronic enclosure cooling system according to claim 1 wherein:

said cooling system unit comprises a heat sink; and said heat sink is a battery tray.

20. The method of claim 17, wherein:

said step of passing said heat transfer fluid through a heat exchanger comprises passing said heat transfer fluid through a flat pack radiator.

* * * * *

UNITED STATES PATENT AND TRADEMARK OFFICE
CERTIFICATE OF CORRECTION

PATENT NO.    : 6,462,949 B1
DATED         : October 8, 2002
INVENTOR(S)   : Overton L. Parish et al.

It is certified that error appears in the above-identified patent and that said Letters Patent is hereby corrected as shown below:

Column 4,
Line 6, replace "will now hit be" with -- will now be --
Lines 39-40, replace "fluid to be 40 passed" with -- fluid to be passed --

Column 7,
Line 6, replace "maybe used" with -- may be used --

Column 8,
Line 60, replace "Byway of example" with -- By way of example --

Column 9,
Line 63, replace "unitary array of micro tubes" with -- unitary array of microtubes --

Signed and Sealed this

Eighth Day of April, 2003

JAMES E. ROGAN
*Director of the United States Patent and Trademark Office*